(12) United States Patent
Lindner et al.

(10) Patent No.: US 7,020,229 B2
(45) Date of Patent: Mar. 28, 2006

(54) PHASE-LOCKED LOOP

(75) Inventors: Manfred Lindner, Unterhaching (DE); Dirk Scheidler, München (DE)

(73) Assignee: Infineon Technologies AG, Munich (DE)

( * ) Notice: Subject to any disclaimer, the term of this patent is extended or adjusted under 35 U.S.C. 154(b) by 709 days.

(21) Appl. No.: 09/968,731

(22) Filed: Oct. 1, 2001

(65) Prior Publication Data
US 2002/0051509 A1 May 2, 2002

(30) Foreign Application Priority Data
Sep. 30, 2000 (DE) ................. 100 48 590

(51) Int. Cl.
*H03D 3/24* (2006.01)
(52) U.S. Cl. ..................... 375/376; 327/156
(58) Field of Classification Search ............... 375/376, 375/156, 373, 371; 327/156
See application file for complete search history.

(56) References Cited

U.S. PATENT DOCUMENTS

| | | | |
|---|---|---|---|
| 3,870,971 A * | 3/1975 | Takahashi et al. ...... 331/108 D |
| 4,694,261 A * | 9/1987 | Ewen et al. .................. 331/57 |
| 4,987,387 A * | 1/1991 | Kennedy et al. ............ 331/1 A |
| 5,021,749 A * | 6/1991 | Kasai et al. .................. 331/17 |
| 5,144,156 A * | 9/1992 | Kawasaki .................... 327/157 |
| 5,373,255 A | 12/1994 | Bray et al. |
| 5,382,922 A | 1/1995 | Gersbach et al. |
| 5,598,405 A * | 1/1997 | Hirose ........................ 370/280 |
| 5,724,008 A | 3/1998 | Ferraiolo et al. |
| 6,008,693 A * | 12/1999 | Heinke ........................ 329/325 |
| 6,028,905 A * | 2/2000 | Gaines ........................ 375/376 |
| 6,211,743 B1 * | 4/2001 | Rhee et al. .................... 331/34 |
| 6,282,249 B1 * | 8/2001 | Tomesen et al. ............ 375/327 |
| 2002/0008589 A1 * | 1/2002 | Lanoman et al. ............ 331/34 |

FOREIGN PATENT DOCUMENTS

EP 0 072 751 A2 2/1983

OTHER PUBLICATIONS

Tietze/Schenk: "Halbleiter-Schaltungstechnik" [electronic circuits], 11$^{th}$ ed., Springer Verlag, Berlin, pp. 1284-1285, and corresponding English translation from the 9$^{th}$ ed., pp. 860-861.

* cited by examiner

*Primary Examiner*—Stephen Chin
*Assistant Examiner*—Jia Lu
(74) *Attorney, Agent, or Firm*—Laurence A. Greenberg; Werner H. Stemer; Ralph E. Locher

(57) ABSTRACT

A phase-locked loop is described and has a phase detector that provides at its output per clock cycle a current pulse whose pulse duration is a measure of a phase difference between an input signal and an output signal of the phase-locked loop. A loop filter is connected downstream of the phase detector. The loop filter has a converter device, at least one controllable switching device and at least two switchable capacitive elements for storing a current pulse. In which case the converter device, the switching device and the capacitive elements can be connected up in such a way that the converter device provides a proportional current from a current pulse coupled into at least one of the capacitive elements. An amplitude of the proportional current is constant over the entire length of a clock period. An oscillator is connected downstream of the loop filter, into which oscillator the proportional current can be coupled.

10 Claims, 3 Drawing Sheets

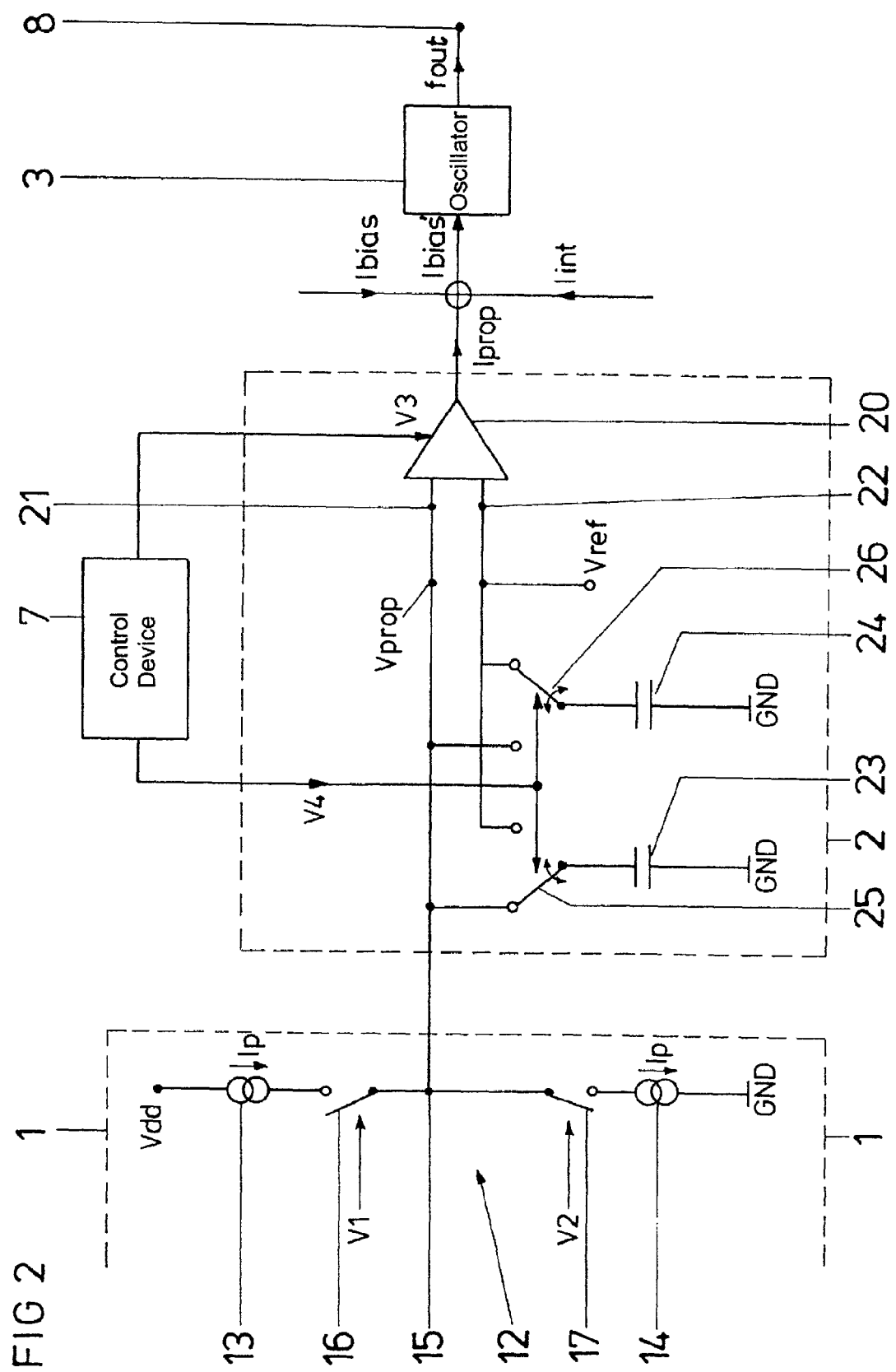

PHASE-LOCKED LOOP

BACKGROUND OF THE INVENTION

Field of the Invention

The invention relates to a phase-locked loop having a phase detector, a loop filter and an oscillator.

Phase-locked loops (PLL) are widespread in electronics and are used for generating and synchronizing clock signals, for example clock signals in microelectronic circuits including microprocessors. Phase-locked loops are configured to synchronize an oscillator with an input signal in a manner that is correct in terms of phase and/or frequency.

A phase-locked loop typically contains a series-connected phase detector, loop filter and oscillator and also a feedback path. The basic configuration and method of operation of a phase-locked loop is described for example in a reference by Tietze, Schenk, titled "Halbleiter-Schaltungstechnik [Semiconductor Circuitry]", 11th extended edition, Springer Verlag, 1999, in particular FIG. 24.20.

If a phase and/or frequency deviation occurs between the input signal and the output signal of the phase-locked loop, the phase detector generates a detector signal with which the oscillator connected downstream is readjusted until the phase and frequency are synchronized again. In the synchronized state, there is frequency identity and the phase shift between the input signal and the oscillator output signal is zero or 90°. This is referred to as a locked phase-locked loop. Phase-locked loops can also be used for frequency division or frequency multiplication if a corresponding multiplier or divider is provided in the feedback path.

In the event of a phase difference between the input signal and the output signal, the phase detector generates voltage pulses whose length corresponds to the phase difference. The voltage pulses drive a charge pump which is typically disposed in the phase detector and, as a function of the signals present at the phase detector, or the sign of the phase difference, adds a pulsed proportional current to, or subtracts it from, the reference current of the (current-controlled) oscillator. The oscillator, to which the reference current is fed for the purpose of setting the operating point, generates the frequency-modulated PLL output signal from this.

As a result of the superposition of the reference current of the oscillator with the pulsed proportional current, the output frequency of the oscillator is changed for precisely the pulse duration. However, such abrupt changes in frequency are undesirable for the functioning of the phase-locked loop, since they are a source of so-called jitter, which should be avoided in phase-locked loops.

Since the output frequency of the oscillator is intended to be as constant as possible, the change in frequency caused by the pulse of the proportional current must be kept small. This can be achieved for example by use of a proportional current that is as small as possible. However, the proportional current that is added to, or subtracted from, the reference current of the oscillator cannot be made arbitrarily small, for reasons of control engineering. In order to realize very small proportional currents, the capacitances of the loop filter would have to be given considerably larger values, thereby increasing the risk of an unstable control loop in which the control loop starts to oscillate. Furthermore, the larger capacitances of the loop filter also mean that a larger chip area is required for the phase-locked loop in an integrated circuit.

SUMMARY OF THE INVENTION

It is accordingly an object of the invention to provide a phase-locked loop that overcomes the above-mentioned disadvantages of the prior art devices of this general type, which has the least possible change in the oscillator output frequency.

With the foregoing and other objects in view there is provided, in accordance with the invention, a phase-locked loop. The phase-locked loop contains a phase detector having an output outputting, per clock cycle, a current pulse with a pulse duration being a measure of a phase difference between an input signal and an output signal of the phase-locked loop. A loop filter is connected downstream of the phase detector, the loop filter having a converter device, at least one controllable switching device connected to the converter device, and at least two switchable capacitive elements for storing a current pulse and connected to the controllable switching device. The converter device, the controllable switching device and the switchable capacitive elements are able to be connected up such that the converter device provides a proportional current derived from the current pulse coupled into at least one of the switchable capacitive elements, the proportional current having an amplitude being constant over an entire length of a clock period. An oscillator is connected downstream of the loop filter, the oscillator receives the proportional current.

The loop filter is typically, but not necessarily, configured as a switchable low-pass filter, in which case, in each case per clock period of the PLL input signal, a respective other capacitive element is connected to the input of a converter device. What is thus achieved with the aid of the phase-locked loop according to the invention, or its loop filter, is that the proportional current superposed on the reference current is distributed as far as possible uniformly over the entire duration of a clock period. However, the integral of the proportional current with respect to a clock cycle still corresponds to the integral of the current pulse. As a result, the changes in frequency can advantageously be distributed over the entire duration of a clock period, which results in that undesirable jitter can be reduced to a minimum amount.

In an advantageous refinement of the invention, the capacitive elements are configured as two connectable capacitors. A proportional voltage can be generated across the capacitors, which can be alternately charged with a current pulse of a charge pump, by integrating the current pulse with respect to time. In this case, the capacitors are driven alternately in such a way that, per clock period, one capacitive element is in each case charged and the respective other capacitive element is discharged again.

In a particularly advantageous refinement of the invention, the loop filter is of a fully differential configuration. Therefore, at least one first capacitor pair and at least one second capacitor pair are provided, which are disposed in a complementary manner with respect to one another, i.e. are driven with current pulses of different polarity. Connected downstream of the differentially disposed capacitor pairs there is in each case a single converter device, which, proceeding from a loop filter that is not constructed differentially, only have to be modified slightly. Differentially constructed loop filters have the advantage over conventional loop filters that they are less susceptible to interference with respect to supply voltage fluctuations and/or with respect to a signal noise.

In a typical refinement of the invention, the oscillator is configured as a current-controlled oscillator, in particular as a ring oscillator.

For the purpose of setting the operating point of the oscillator, a digital-to-analog converter is typically provided, which feeds a reference current to the oscillator. A controlled current source for supplying current to the oscillator would also be conceivable here. The proportional current generated by the loop filter on the output side is typically superposed on the reference current of the digital-to-analog converter.

Furthermore, the loop filter also typically generates an integral current that is a measure of the frequency deviation between the PLL output signal and the input signal of the phase-locked loop. The integral current can likewise be superposed on the reference current. The resultant current is then coupled into the oscillator, which generates the frequency-modulated PLL output signal from this.

A control device is advantageously provided in order to control the changeover operation of the changeover devices. The control device may be as an example a program-controlled unit. Furthermore, in a very advantageous refinement, a variable transconductance or gain of the operational amplifier can also be adjusted via the control device. For this purpose, it is possible to program different gains in the control device.

The converter device of the phase-locked loop is typically configured as an operational amplifier that operates as a voltage/current converter. The operational amplifier is connected downstream of the capacitive elements of the loop filter and serves for integrating with respect to time the proportional voltage provided by the capacitive elements to form a proportional current. Any other converter device suitable for converting a voltage into a current would also be conceivable here.

Other features which are considered as characteristic for the invention are set forth in the appended claims.

Although the invention is illustrated and described herein as embodied in a phase-locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit diagram of the phase-locked loop according to the invention in accordance with FIG. 1;

DESCRIPTION OF THE PREFERRED EMBODIMENTS

Figure 1:
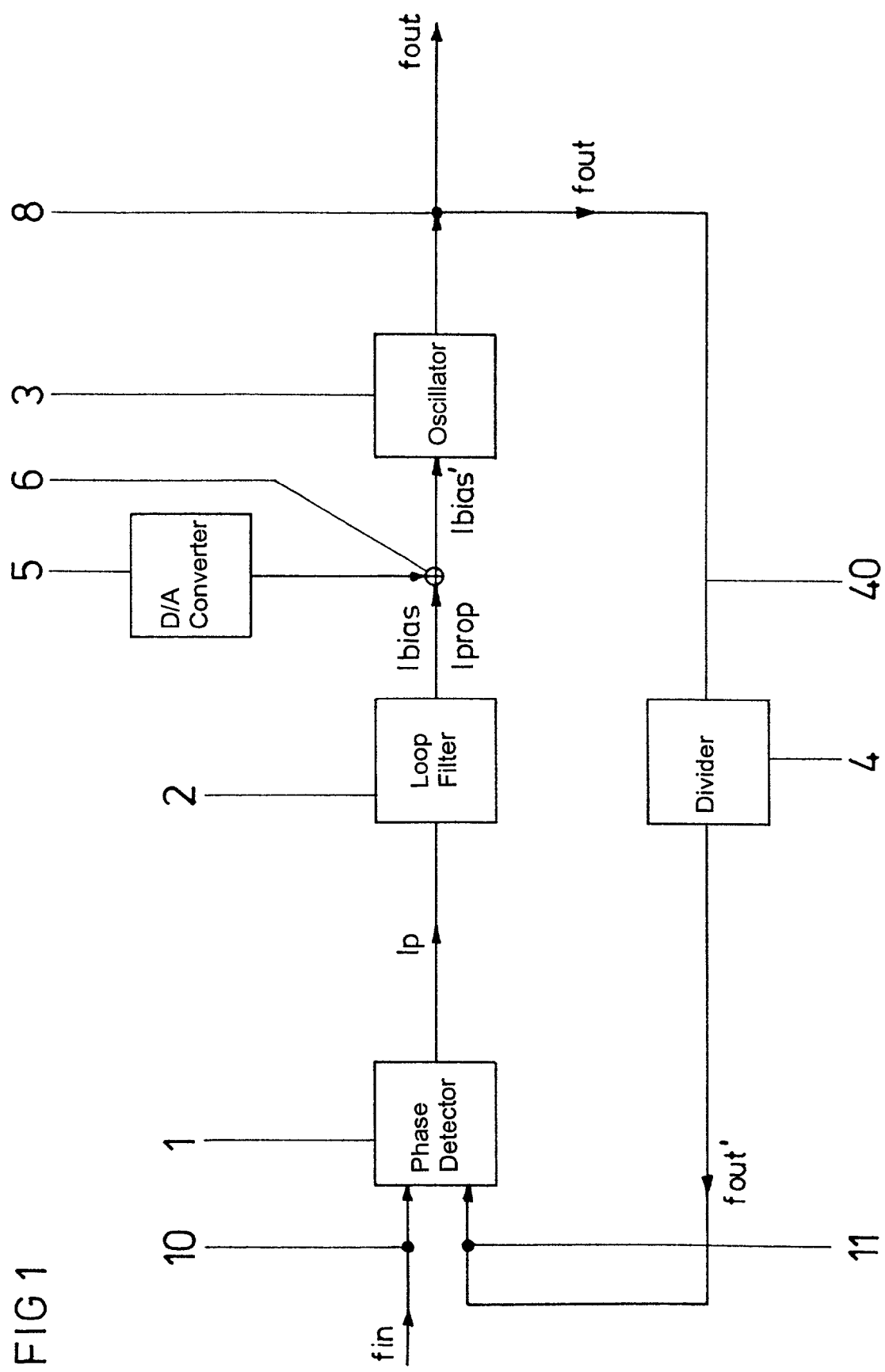
FIG. 1 is a general block diagram of a phase-locked loop according to the invention.

In the figures of the drawing, identical or functionally identical elements and signals have been provided with the same reference symbols, unless indicated otherwise. Referring now to the figures of the drawing in detail and first, particularly, to FIG. 1 thereof, there is shown a general block diagram of a phase-locked loop according to the invention. The phase-locked loop according to the invention has a phase detector 1, a loop filter 2 and an oscillator 3, which are connected in series. The phase detector 1 has two inputs 10, 11, into which an input signal fin and also a signal fout' derived from the PLL output signal fout can be coupled. The phase detector 1 compares the frequency of the input signal fin with the frequency of the output signal fout'. The phase detector 1 generates a current signal Ip which corresponds to the phase difference and is fed to the loop filter 2 connected downstream and, depending on the phase angle of input signal fin and the output signal fout', increases or decreases the potential at the loop filter 2.

The loop filter 2, which is typically realized as a passive low-pass filter, has an integral section and a proportional section. In the text below, attention will mainly be focused on the proportional section, which is provided for controlling the phase angle, whereas the functioning of the integral section, which serves for controlling the frequency, will be discussed only peripherally. The loop filter 2 generates a proportional current Iprop, which is a measure of the phase difference between the input signal fin and the output signal fout'.

The proportional current Iprop is superposed with a reference current Ibias (bias current) from a digital-to-analog converter 5 at a summation point 6. The resultant current Ibias' is coupled into the oscillator 3 connected downstream. The oscillator 3 generates the frequency-modulated PLL output signal fout according to the current Ibias', which output signal can be tapped off at the output 8 of the phase-locked loop. The PLL output signal fout is fed back via a feedback path 40 and a divider device 4 typically contained therein to the input 11 of the phase detector 1, so that a divided-down oscillator output signal or the PLL output signal fout' can be tapped off there.

FIG. 2 shows a circuit detail of the phase-locked loop according to the invention in accordance with FIG. 1 in which, in particular, the loop filter 2 disposed between the oscillator 3 and the phase detector 1 is illustrated in detail.

FIG. 2 shows only a detail of the phase detector 1. In this case, the phase detector 1 has a charge pump 12 containing two current sources 13, 14 connected between a first and a second supply potential Vdd, GND. In this case, the first supply potential Vdd is a positive supply potential, while the second supply potential GND has the reference ground potential. The current sources each generate a constant current Ip having opposite signs.

The proportional current Ip can be tapped off at a center tap 15 between the two current sources 13, 14, that is to say at the output 15 of the phase detector 1, which proportional current can be fed to the loop filter 2 connected downstream. A controllable switch 16, 17 is in each case disposed between the center tap 15 and the respective current sources 13, 14. The controllable switches 16, 17 are in each case driven by an analog drive signal V1, V2, which is likewise generated by the phase detector 1. Thus, for example in the event of a positive phase difference between input signals fin, fout', a drive signal V1 is generated which closes the first controllable switch 16 and thus causes a positive current pulse Ip to be applied to the loop filter 2. Conversely, a negative current pulse Ip is applied to the loop filter 2 when a drive signal V2 caused by a negative sign of the phase difference closes the second controllable switch 17.

The loop filter 2 has an operational amplifier 20 operating as a voltage/current converter. The operational amplifier 20 has two inputs 21, 22, the first input 21 is connected to the output 15 of the phase detector 1. The second input 22 of the operational amplifier 20 is connected to a reference potential Vref. Furthermore, provision is made of two integration capacitances 23, 24 for a low-pass filter, which on the one hand are connected to the reference ground potential GND and on the other hand can each be connected between the two inputs 21, 22 of the operational amplifier 20 via a changeover device 25, 26. The changeover devices 25, 26 can likewise be realized by MOSFETs. At its output, the operational amplifier 20 generates the proportional current Iprop, which, at a summation point 6, is superposed with the reference current Ibias and also an integral current Iint, which is typically likewise generated by the loop filter 2. The resultant current Ibias' drives the oscillator 3 in such a way that the frequency-modulated PLL output signal can be tapped off at the output of the oscillator 3.

In an advantageous refinement, a control device 7 is provided, which may be configured e.g. as a program-controlled unit, for example as a microprocessor, as a microcontroller or the like, and drives the changeover devices 25, 26 by a first drive signal V4 in such a way that one integration capacitance 23 is in each case connected to the first input 21 and the respective other integration capacitance 24 is connected to the second input 22 of the operational amplifier 20.

Furthermore, in a further advantageous refinement, the control device 7 can drive the operational amplifier 20 with a second drive signal V3, by which, by way of example, a gain of the voltage/current converter 20 configured as an operational amplifier can be suitably adjusted. Different gains or transconductances of the operational amplifier 20 that are programmed in the control device 7 would be conceivable here, depending on the application.

The method of operation of the phase-locked loop according to the invention in accordance with FIGS. 1 and 2 is explained in more detail below.

Figure 3A:
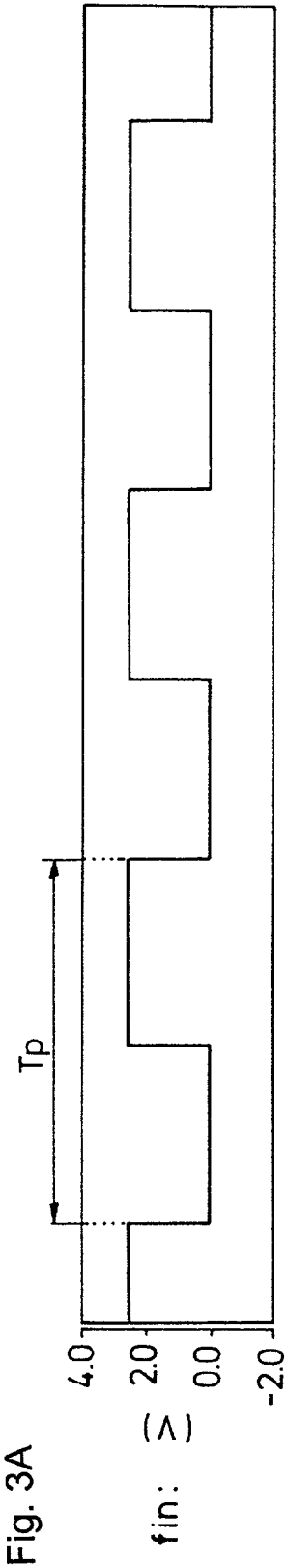
FIGS. 3A–3C are signal/time diagrams of the phase-locked loop according to the invention.
Figure 3B:
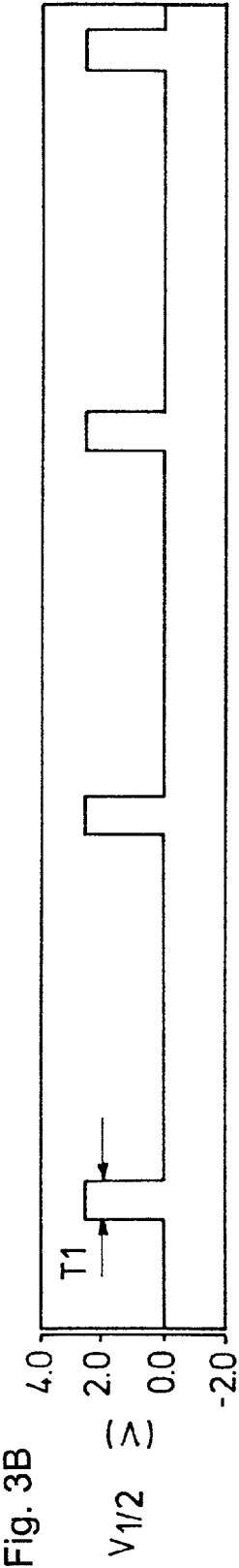

The current pulse Ip generated by the charge pump 12 in each case charges the integration capacitance 23 which is connected to the first input 21 of the operational amplifier 20, for a duration T1 of the current pulse Ip (see FIG. 3B). This results in a rise in the voltage Vprop dropped across the integration capacitance 23 (see FIG. 3C). The so-called proportional voltage Vprop, which is a measure of the current pulse Ip and thus of the phase difference, is stored throughout the clock period. Consequently, the following equation results:

$$\int_0^{Tp} I p \, dt = C_x \int_0^{Tp} (Vprop - Vref) \, dt, \quad (1)$$

In this case, Tp designates the period duration of a clock signal (see FIG. 3A), t designates the time and Cx designates the capacitance of the respective integration capacitance 23, 24 that is currently connected up.

The operational amplifier 20 operating as a voltage/current converter transforms the proportional voltage Vprop, coupled into the first input 21, into the proportional current Iprop as follows:

$$\Delta Iprop = GM \, \Delta U = GM(Vprop - Vref), \quad (2)$$

In this case, GM designates the gain or the transconductance of the operational amplifier.

The proportional current Iprop is added to, or subtracted from, the reference current Ibias, depending on the sign. During the next clock period Tp, the first integration capacitance 23, which was charged during the last clock period Tp, is connected to the second input 22 of the operational amplifier 20 via the changeover device 25. At the same time, the second integration capacitance 24 is connected to the first input 21. In this case, the second integration capacitance 24 is charged, while the first integration capacitance 23 is discharged via the reference ground potential GND.

In this way, it can be ensured that the comparatively high, but short current pulses Ip of duration T1 which are generated by the charge pump 12 are distributed over the entire clock period Tp by the integration capacitances 23, 24 that can be connected and disconnected. The particular advantage consists in the fact that the amplitude of the proportional current Iprop generated by the loop filter 2 on the output side can thereby be significantly reduced. Equally, the change in frequency at the output of the phase-locked loop is significantly reduced in this way. Although the change in frequency at the output of the PLL is not completely eliminated by the phase-locked loop according to the invention, the change in frequency nonetheless remains constant over the entire clock period Tp, whereas in the case of a phase-locked loop of the type mentioned in the introduction, it is very large for the duration of a current pulse and then almost zero, which ultimately leads to very high jitter.

By virtue of the fact that the duration T1 of the current pulse Ip caused by a phase difference is typically significantly shorter than the period duration Tp of a clock signal, the proportional current Iprop generated by the loop filter 2 becomes minimal without this involving major additional circuitry measures which have an influence on the control mechanism and/or an influence on the chip area of the phase-locked loop.

Figure 3C:
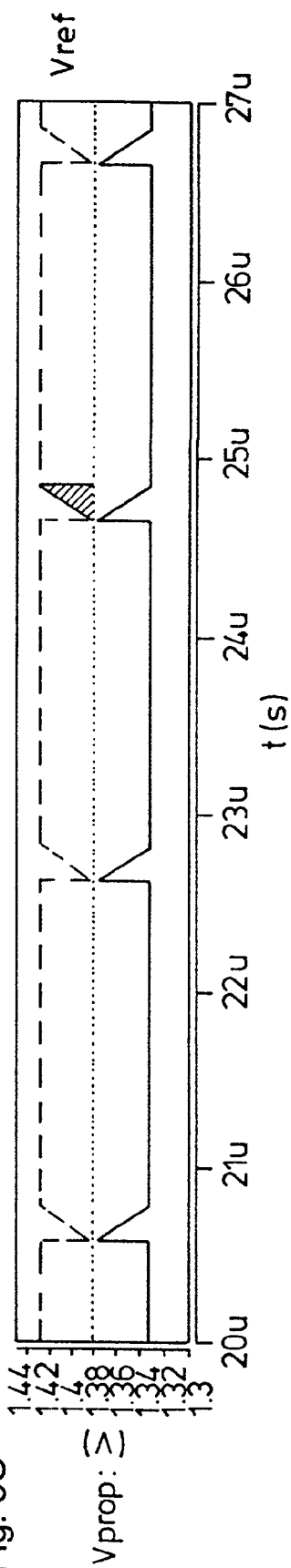

The above-described method of operation of the phase-locked loop according to the invention also becomes clear from the signal/time diagrams illustrated in FIGS. 3A–3C. The drive signals V1, V2 in FIGS. 3A–3C are a measure of the current Ip.

What is thus achieved by the phase-locked loop according to the invention, in particular the loop filter 2, is that the amplitude of the current pulse which is generated by the charge pump is much greater than the amplitude of the proportional current generated by the loop filter 2. In contrast, the time integral over these currents with respect to the same clock period is identical.

The invention shall not be restricted exclusively to the exemplary embodiments of FIGS. 1 and 2. Rather, the operational amplifier 20 illustrated in FIG. 2 can be replaced by any other voltage/current converter. Furthermore, the integration capacitances 23, 24 could be varied in manifold ways in number and type. By way of example, the capacitances could also be realized by a variable-capacitance diode or a variable-capacitance transistor. Furthermore, more than two integration capacitances 23, 24 could also be provided.

To summarize, it can be stated that a control characteristic for a phase-locked loop which reduces undesirable jitter to the greatest possible extent can be provided by the phase-locked loop constructed in the manner described, by simple adaptation of the circuitry connections of the integration capacitances, in a simple but nevertheless highly effective manner.

The present invention has been set forth using the above description in such a way as to explain as well as possible the principle of the invention and its practical application. It goes without saying that the present invention can be realized in diverse embodiments and modifications in a suitable manner within the scope of expert action and knowledge.

We claim:

1. A phase-locked loop, comprising:
   a phase detector having an output outputting, per clock cycle, a current pulse with a pulse duration being a measure of a phase difference between an input signal and an output signal of the phase-locked loop;

a loop filter connected downstream of said phase detector, said loop filter having a converter device, at least one controllable switching device connected to said converter device, and at least two switchable capacitive elements for storing said current pulse and connected to said controllable switching device, said converter device, said controllable switching device and said switchable capacitive elements able to be connected up such that said converter device provides a proportional current derived from said current pulse coupled into at least one of said switchable capacitive elements, the proportional current having an amplitude being constant over an entire length of a clock period; and an oscillator connected downstream of said loop filter, said oscillator receiving the proportional current.

2. The phase-locked loop according to claim 1, wherein said switchable capacitive elements have at least two capacitors which can be connected alternately to said phase detector, the current pulse being applied, in each clock period, to one of said two capacitors through said controllable switching device, while the other of said two capacitors is discharged.

3. The phase-locked loop according to claim 1, wherein said loop filter is of a fully differential configuration and said switchable capacitive elements include a first capacitor pair and a second capacitor pair connected to said converter device through said controllable switching device.

4. The phase-locked loop according to claim 1, wherein said oscillator is a current-controlled oscillator.

5. The phase-locked loop according to claim 1, including a digital-to-analog converter setting an operating point of and connected to said oscillator, said digital-to-analog converter generating a reference current.

6. The phase-locked loop according to claim 5, wherein the proportional current is superposed on the reference current, in which case a resultant current can be fed to said oscillator, said oscillator generating the output signal in dependence thereof.

7. The phase-locked loop according to claim 6, wherein said loop filter generates an integral current being a measure of a frequency difference between the input signal and the output signal and is superposed on the reference current.

8. The phase-locked loop according to claim 1, including a control device connected to and controlling at least one of said converter device and said controllable switching device.

9. The phase-locked loop according to claim 1, wherein said oscillator is a ring oscillator.

10. A phase-locked loop, comprising:

a phase detector having an output outputting, per clock cycle, a current pulse with a pulse duration being a measure of a phase difference between an input signal and an output signal of the phase-locked loop;

a loop filter connected downstream of said phase detector, said loop filter having a converter device, at least one controllable switching device connected to said converter device, and at least two switchable capacitive elements for storing said current pulse and connected to said controllable switching device, said converter device, said controllable switching device and said switchable capacitive elements to be connected to cause said converter device to provide a proportional current derived from said current pulse coupled into at least one of said switchable capacitive elements, the proportional current having an amplitude being constant over an entire length of a clock period;

each of said at least two switchable capacitive elements being switchable between a first position coupling the switchable contact of each switchable capacitive element to the output of said phase detector or a second position coupling the switchable contact of each switchable capacitive element to a reference voltage; and an oscllator connected downstream of said loop filter, said oscillator receiving the proportional current.

* * * * *